US005721547A

United States Patent [19]
Longo

[11] Patent Number: 5,721,547
[45] Date of Patent: Feb. 24, 1998

[54] ANALOG-TO-DIGITAL CONVERTER EMPLOYING DC OFFSET CANCELLATION AFTER MODULATION AND BEFORE DIGITAL PROCESSING

[75] Inventor: Lorenzo L. Longo, Dove Canyon, Calif.

[73] Assignees: Asahi Kasei Microsystems Ltd., Tokyo, Japan; Oasis Design, Inc., Austin, Tex.

[21] Appl. No.: 582,644

[22] Filed: Jan. 4, 1996

[51] Int. Cl.$^6$ .................................................. H03M 1/10
[52] U.S. Cl. .......................... 341/118; 341/119; 341/120; 341/121
[58] Field of Search .............................. 341/118, 119, 341/120, 121

[56] References Cited

U.S. PATENT DOCUMENTS

| | | |
|---|---|---|
| 4,542,354 | 9/1985 | Robinton et al. . |
| 4,805,192 | 2/1989 | Confalonieri et al. ................. 375/25 |
| 4,851,841 | 7/1989 | Sooch . |
| 4,920,544 | 4/1990 | Endo et al. . |
| 4,943,807 | 7/1990 | Early et al. . |
| 5,061,928 | 10/1991 | Karema et al. ......................... 341/143 |
| 5,148,166 | 9/1992 | Ribner . |
| 5,561,660 | 10/1996 | Kotowski et al. ...................... 370/12 |

OTHER PUBLICATIONS

Franca, et al., "Design of Analog—Digital VLSI Circuits for Telecommunications and Signal Processing", 2$^{nd}$ Edition, Prentice Hall, pp. 251–289.

Hogenauer, "An Economical Class of Digital Filters for Decimation and Interpolation", IEEE Trans. on Acoustincs, Speech and Signal Processing, vol. ASSP-29, No. 2 (Apr., 1981).

Chu, et al. "Multirate Filter Designs Using Comb Filters", IEEE Trans. on Circuits and Systems, vol. CAS-31, pp. 913–924 (Nov., 1984).

Moussavi, et al., "High–Order Single–Stage Single–Bit Oversampling A/D Converters Stabilized with Local Feedback Loops", IEEE Trans. on Circuits and Systems, vol. 41, No. 1, pp. 19–25 (Jan., 1994).

Crochiere, et al., "Interpolation and Decimation of Digital Signals—A Tutorial Review", Proc. IEEE, vol. 69, pp. 300–331 (Mar., 1981).

Primary Examiner—Jeffrey A. Gaffin
Assistant Examiner—Jason H. Vick
Attorney, Agent, or Firm—Kevin L. Daffer; Conley, Rose & Tayon

[57] ABSTRACT

An analog-to-digital (A/D) converter is provided for converting an analog signal to a digital signal, wherein the digital signal is corrected such that it does not contain DC offset. The A/D converter preferably comprises a delta-sigma modulator and an offset compensation circuit. The offset compensation circuit is coupled to the output of the modulator or, according to another embodiment, to the output of a noise cancellation circuit. The offset compensation circuit can calibrate a single bit output from the modulator or a multi-bit output from the noise cancellation logic. In the former instance, the offset compensation circuit includes an up/down counter and register; in the latter instance, the calibration circuit includes an accumulator. The offset compensation circuit counts or accumulates a digital representation of DC offset. The counted or accumulated value is stored and thereafter subtracted from a digitally represented analog input signal subsequently applied to the modulator during a normal operation mode. Accordingly, the analog input signal is converted to a digital signal absent DC offset.

22 Claims, 3 Drawing Sheets

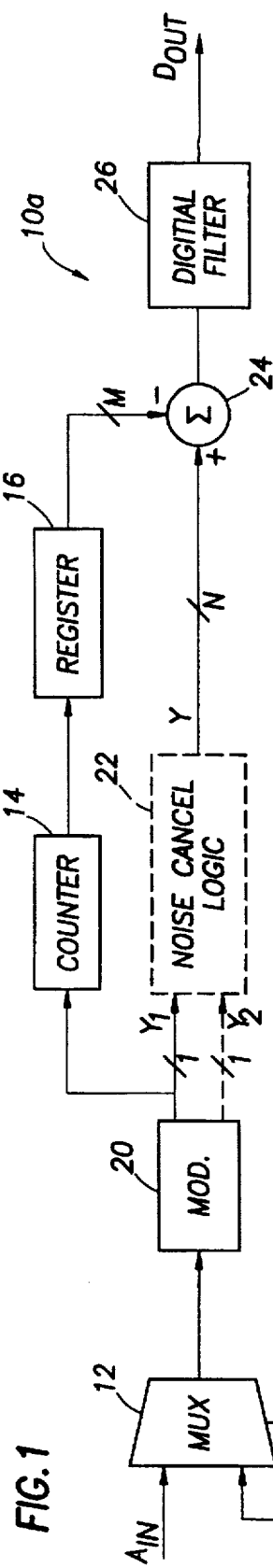
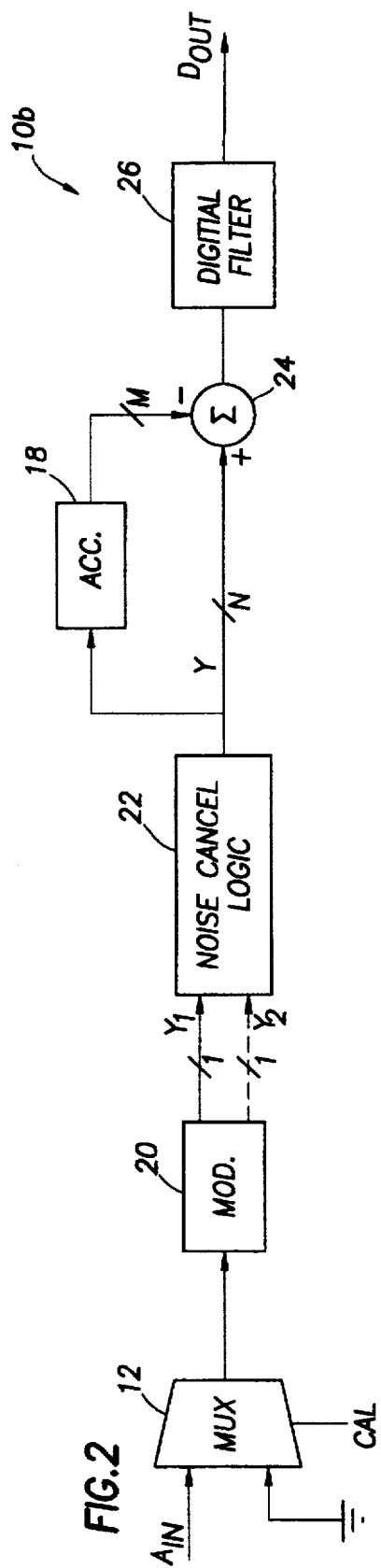
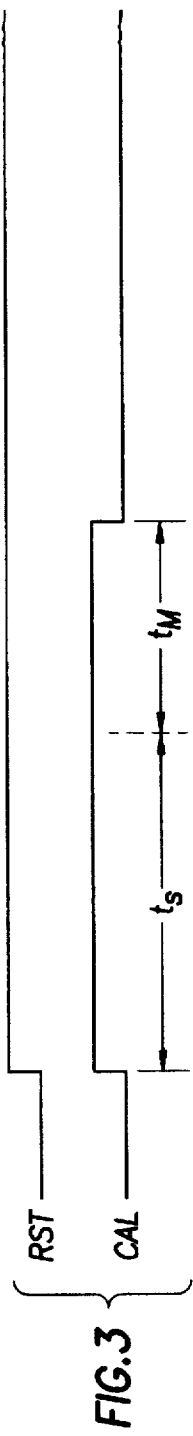
FIG. 1
FIG. 2
FIG. 3

ANALOG-TO-DIGITAL CONVERTER EMPLOYING DC OFFSET CANCELLATION AFTER MODULATION AND BEFORE DIGITAL PROCESSING

BACKGROUND OF THE INVENTION

1. Field of the Invention

This invention relates to an analog-to-digital (A/D) converter, and more particularly to a modulator portion of the A/D converter. The converter can correct for DC offset at the modulator output prior to digital filtering and/or decimation.

2. Description of the Relevant Art

Integrated circuits which embody both analog and digital circuitry on the same monolithic substrate are well known. Examples of such integrated circuits include audio acquisition and/or transmission products. Audio acquisition includes any device which samples and quantizes an audio waveform according to discrete time intervals. Audio acquisition thereby includes A/D converters.

Generally speaking, A/D converters include a front-end modulator, such as a pulse code modulator or a delta-sigma modulator. Regardless of the type of modulator used, proper audio acquisition requires the incoming analog signal be sampled at a frequency of at least twice the incoming audio frequency to achieve error-free sampling. During each sample interim, quantatization is used to preserve corresponding amplitude information. While sampling records time slices, quantatization records amplitude information within each time slice. A modulator thereby employs a combination of sampling and quantatization to preserve the audio signal in digital form. The front-end modulator thereby utilizes analog circuitry useful in sampling and quantization.

Many A/D converters, especially converters using delta-sigma modulators, include a back-end digital filter. Depending upon its application, the digital filter may also employ decimation. The digital filter is typically used to remove quantatization noise introduced during modulation. The decimator digitally resamples the filtered output to a lower data rate than that of the modulator sampling frequency.

Within recent years, delta-sigma modulators have become very popular. A delta-sigma modulator generally involves a mechanism for sampling an analog signal, integrating that sampled signal, and then quantizing the signal to digital form. The output from a delta-sigma modulator is a serial stream of logic 1s and 0s at a rate determined by the sampling clock frequency. If the analog input signal is near positive fullscale, there will be more logic 1s than logic 0s in the bitstream. Likewise, for signals near negative fullscale, there will be more logic 0s than logic 1s in the bitstream. For signals near midscale, there should be approximately an equal number of logic 1s to logic 0s. However, as will be described herein below, signals near midscale do not in all instances produce an equal number of logic 1s and logic 0s.

One of the important characteristics of a delta-sigma modulator is its noise shaping feature. That is, the modulator shapes the frequency spectrum such that a majority of noise output from the modulator lies at a frequency which can be filtered by the digital filter. There are numerous types of digital filters. Some digital filters, such as finite impulse response (FIR) filters compute a moving weighted average of the input digital bitstream (i.e., a series of logic 1s and logic 0s sent over a single conductor) while digitally resampling the filtered output using a process called decimation. FIR techniques may thereby compute a filter output for several input samples. Conversely, infinite impulse response (IIR) filters compute a digital output for every input sample, and therefore decimation can not be performed as part of the IIR algorithm. FIR and IIR techniques are just two of many types of digital filter algorithms used at the back end of most conventional A/D converters.

High performance A/D converters may involve extensive modulator architecture noise cancellation circuitry. In many instances, higher order delta-sigma modulators are needed to enhance the analog filter characteristics. Higher order modulators can realize, for example, a more drastic transfer function slope than that achieved by lower order modulators. Further, low or high order modulators can be cascaded with one another to form a multi-stage architecture. At the output of the cascaded modulators is a noise cancellation circuit which can cancel, or substantially suppress, quantatization noise of the lower stage modulator (or modulators).

Examples of cascaded delta-sigma modulators are shown in reference to U.S. Pat. Nos. 4,920,544; 5,061,928; and 5,148,166 (herein incorporated by reference). The cascaded modulators set forth in each of the aforesaid patents include various delay elements and differentiators coupled to modulator outputs. Differentiators, delay elements and summing nodes arranged therebetween, substantially cancel or suppress quantization noise of the first stage quantizer output. Similarly, like elements can also be used to cancel or suppress quantization noise of the second stage.

Regardless of whether an A/D converter employs a single stage or employs many stages of modulators, each having multiple orders, an inherent problem of DC offset remains. DC offset is a relatively acute problem if the modulator is to operate over a wide dynamic range. DC offset is present at the output of the modulator, indicated by more logic 1s or logic 0s then there should be for that given analog input voltage. Under ideal conditions, if a ground voltage is applied to the input of a modulator, the digital bitstream at the quantizer output should result in an equal number of logic 0s to logic 1s. Unfortunately, DC offset occurs within the modulator internal components, i.e., operational amplifiers, etc., which causes the digital bitstream to read an offset when it should be at 0.

If the DC offset value is known, it can be readily corrected. Using feedback in the modulator is one type of offset correction illustrated in U.S. Pat. No. 4,542,354 (herein incorporated by reference). Implementing compensation in the modulator analog section can be somewhat burdensome and difficult to achieve since it may require adjustment of capacitor values, etc. Other DC offset correction techniques involve correction at the output of the digital filter or digital processor. An example of such a technique is described in U.S. Pat. No. 4,943,807 (herein incorporated by reference).

A need exists for compensating or correcting DC offset without having to do complex modification within the modulator front-end or correction within the FIR or IIR filter algorithms. Such schemes should be avoided if an alternative calibration technique is discovered which can be more easily employed between the modulator and the digital filter. The desired technique must be one capable of use at the output of either a single stage (of order one or greater), or a cascade of such single stage modulators.

SUMMARY OF THE INVENTION

The problems outlined above are in large part solved by a DC offset correction technique performed at the output of the modulator, rather than within the modulator or at the output of the digital filter. DC offset compensation is performed in a less complex fashion using a counter or accumulator placed at the respective outputs of the modulator or noise cancellation circuit. Instead of compensating digital output from a digital filter, the present technique compensates the digital signal sent from the modulator prior to the digital filter. Accordingly, the present correction technique can be carried forth, in its simplest form, upon a single bit modulator output signal instead of on a multi-bit signal commonly associated with a digital filter. In a more complex form, the present correction technique occurs at the multi-bit output of a noise cancellation circuit, instead of on the larger multi-bit word of a digital filter.

The present DC offset compensation technique can be used on a first (or higher) order modulator. According to an alternative embodiment, DC offset compensation technique can be used on a cascaded arrangement of first (or higher) order modulators. In the latter instance, a noise cancellation circuit is used to receive output from the cascaded modulators.

DC offset compensation is carried out, according to one embodiment, using a counter and register coupled to the output of a modulator. The counter and register produce a digital count during a calibration mode of operation (i.e., during a calibration cycle). According to another embodiment, DC offset compensation is carried out using an accumulator coupled to the output of the noise cancellation logic. Output from the accumulator, similar to output from the register, is subtracted during a non-calibration mode of operation (i.e., during normal operation cycle) from the noise cancellation logic output. Accordingly, the counter and register, or accumulator, compute a DC offset value during a calibration cycle, and then subtract that offset value from the modulator output or noise cancellation logic output during a normal operation cycle.

Broadly speaking, the present invention contemplates an apparatus for correcting DC offset at the output of a modulator. The apparatus includes a modulator having a modulator input and a modulator output. The modulator output produces a first bitstream in response to a ground voltage upon the modulator input. A counter is coupled to the modulator output for producing a digital count corresponding to the first bitstream. A summing node is coupled to subtract the digital count from a second bitstream sent from the modulator output in response to an analog signal upon the modulator input. Accordingly, ground voltage is applied to the modulator input during a calibration cycle, and an analog signal is applied to the modulator input during a normal operation cycle.

The present invention further contemplates an apparatus for correcting DC offset within an A/D converter. The A/D converter, according to this embodiment, includes at least two modulators. A first modulator comprises a first modulator input and a first modulator output. At least one integrator and a single quantizer are coupled in series between the first modulator input and the first modulator output. The first modulator output produces a first bitstream in response to a ground voltage upon the first modulator input. A second modulator includes a second modulator output and a second modulator input. The second modulator input is coupled to receive an output of an integrator within the first modulator. A counter is coupled to receive only the first modulator output and store a digital count corresponding to the number of bits within the first bitstream. A noise cancellation logic is coupled to receive the first and second modulator outputs and produce a noise suppressed multi-bit digital signal. A summing node is coupled to subtract the digital count from the noise suppressed multi-bit digital signal in response to an analog signal upon the modulator input.

The present invention further contemplates a method for correcting DC offset within an A/D converter. The method includes the steps of quantizing discrete samples of a ground voltage during a calibration cycle. The quantized ground voltage samples are then stored as a digital DC offset value. Discrete samples of the analog signal are then quantized during a non-calibration cycle. The digital DC offset value is subtracted from the quantized analog signal samples during the non-calibration cycle.

BRIEF DESCRIPTION OF THE DRAWINGS

Other objects and advantages of the invention will become apparent upon reading the following detailed description and upon reference to the accompanying drawings in which:

FIG. 1 is a block diagram of an A/D converter having a DC offset calibration circuit shown according to one embodiment;

FIG. 2 is a block diagram of an A/D converter having a DC offset calibration circuit shown according to another embodiment;

FIG. 3 is a timing diagram of control signals used in selecting calibration and non-calibration (i.e., normal operation) cycles;

Figure 4:
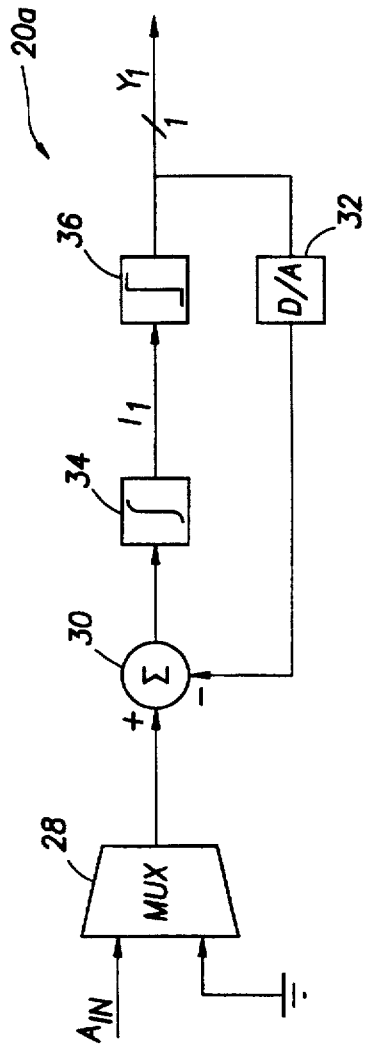
FIG. 4 is a block diagram of a modulator shown according to one embodiment, wherein the modulator is adapted for placement in the modulator block of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a block diagram of an A/D converter 10a according to one embodiment. Converter 10a includes a multiplexer 12 which receives either an analog input signal $A_{IN}$ or analog ground voltage, depending upon the status of a selector signal. The selector signal CAL determines whether converter 10a will undergo calibration or normal operation. A calibration cycle is used to measure the amount of DC offset and is then used to store that offset value in an offset compensation circuit. In the embodiment of FIG. 1, offset compensation circuit comprises a counter 14 and register 16.

FIG. 1 further illustrates a modulator block 20 coupled to the output of multiplexer 12. Modulator block 20 can be any type of circuit which converts an analog input signal into a continuous serial stream of logic 1s and logic 0s. Preferably, modulator block 20 comprises a delta-sigma modulator, sometimes referred to as an oversampled modulator. Modulator block 20 can include either a single modulator or numerous modulators coupled together in a cascaded arrangement. If a single modulator is used, then only a single output of digital bitstream $Y_1$ occurs. If a cascaded arrangement of multiple modulators are used, then two bitstream outputs $Y_1$ and $Y_2$ occur. $Y_1$ indicates the bitstream from the single modulator or the first stage modulator of the cascaded modulators, and $Y_2$ denotes the bitstream output from the second stage modulator of the cascaded modulators. Each modulator within the cascaded arrangement can either be a first order modulator, a second order modulator, a third order modulator, etc. For sake of brevity, only one (or possibly two as indicated by dashed line) output is shown. However, it is understood that one, two, or more than two stages of modulators may be used.

If modulator block 20 employs a cascaded arrangement of two or more modulators, noise cancellation logic 22 will be present. Noise cancellation logic 22 is shown, according to one embodiment, at the output of a two stage, cascaded modulator architecture. Noise cancellation logic 22 functions to cancel quantization noise within signal $Y_1$ in lieu of lesser quantization noise within signal $Y_2$. If modulator block 20 comprises a single modulator, then noise cancellation logic is not needed and modulator output $Y_1$ is fed directly to summing node 24.

During a calibration mode of operation, multiplexer 12 selects a ground voltage input and places that ground voltage upon modulator block 20. Modulator block 20 thereafter produces a first digital bitstream $Y_1$ which contains a dominant amount of the DC offset relative to second or third stage signal outputs, such as bitstream $Y_2$ from the second stage output. With a ground voltage input, bitstream $Y_1$ should ideally comprise an equal number of logic 1s to logic 0s. However, due to DC offset within modulator block 20, signal $Y_1$ may produce more logic 1s than logic 0s, or vice versa. While still in calibration mode, counter 14 counts up for each logic 1 and down for each logic 0. If the number of logic is exceed logic 0s, then counter 14 will place in register 16 a positive count at the conclusion of the calibration cycle. Conversely, if logic 0s exceed logic 1s, then counter 14 will place a negative count within register 16. Counter 14 includes any device comprising flip-flops and associate gating. The number of flip-flops determines the number of count states. For example, a three-stage counter will have a maximum of eight states, possibly represented as a 3 bit parallel output from counter 14. Counter 14 can be either a ripple or synchronous counter, and can count positive and negative numbers using two's complement notation. Synchronous up/down counters can be obtained with up/down clocking inputs and carry/borrow cascading outputs.

The DC offset value stored within register 16 remains within register 16 until after the conclusion of the calibration mode. When calibration mode is terminated, normal operation begins, or resumes. Normal operation entails a selection of analog input signal $A_{IN}$ by multiplexer 12. The analog input signal is modulated at block 20, and a second bitstream is produced as signal $Y_1$. The second bitstream is representative of a unique voltage magnitude of $A_{IN}$ during a sampled time slice. The second bitstream, however, contains DC offset thereby giving a false reading of $A_{IN}$ during that sample. Depending upon the presence or absence of noise cancellation logic 22, the second bitstream is represented as noise-suppressed signal Y or modulator output signal $Y_1$, either of which occur during a normal operation cycle. The previously stored DC offset value within register 16 is subtracted from the second bitstream of either $Y_1$ or Y by summing node 24. For example, if DC offset value is a positive digital number, that digital number or count is subtracted from the digital number of signal $Y_1$ or signal Y for each sample. An offset-corrected output signal results from summing node 24. The offset-corrected output signal is then forwarded to a digital filter 26. Digital filter serves as an anti-aliasing filter with respect to a final sampling rate, and it filters out the higher frequency noise produced by the noise-shaping delta-sigma modulator. Digital filter 26 can include any filtering algorithm, such as FIR, IIR, comb, etc. In certain instances, digital filter 26 includes a decimator which reduces the sampling rate after filtering is performed.

Turning now to FIG. 2, an alternative embodiment showing A/D converter 10b is presented. Converter 10b is similar to converter 10a, except that an accumulator 18 is used in lieu of counter 14 and register 16. Accumulator 18 derives its input from the output of noise cancellation logic 22. Contrary to counter 14 having a single bit input and a multi-bit output, accumulator 18 input is a multi-bit input N with a multi-bit output M. Accumulator 18 functions by adding a previous digital value to the current digital value, and thereafter storing the additive result in an accumulation register. The accumulation function (i.e., add and accumulate store) occurs during a calibration cycle in which a ground voltage is selected by multiplexer 12. Accordingly, in the embodiment shown in FIG. 2, DC offset can be obtained at the output of noise cancellation logic 22 rather than the input of noise cancellation logic 22, as shown in FIG. 1. In order to take into account the multi-bit output from noise cancellation logic 22, accumulator 18 performs multi-bit add and accumulate. Up/down counter 14 is less complex in that only a single bit input is used. Accumulator 18, however, receives a multi-bit input.

FIG. 3 depicts a timing diagram of control signals used in selecting calibration or non-calibration (i.e., normal) modes of operation. Typically, A/D converter 10a or 10b is reset to a low logic value, as shown by signal RST. When signal RST goes high, either A/D converter 10a or 10b is enabled. A high reset value, is shown to correspond with a high transition on the calibration, CAL, signal. A logic high value upon CAL causes multiplexer 12 to select a ground voltage (i.e., analog ground or common mode ground). Accordingly, a logic high value upon CAL causes measurement of any DC offset within modulator block 20, and storage of that offset as a digital value within register 16 or accumulator 18. Offset measurement occurs during time $t_M$, after settling time $t_S$ has elapsed. The stored digital value increases or decreases during $t_M$, and a final reading is taken at the conclusion of $t_M$.

Referring now to FIG. 4, delta-sigma modulator block 20 is shown according to an embodiment referenced as numeral 20a. Block 20a comprises a single modulator. The single modulator includes a multiplexer 28 for selecting either analog ground voltage or analog input signal. Coupled to multiplexer 28 is a summing node 30. As part of its function, summing node 30 presents samples to modulator 20a. A typical sampling mechanism involves a switched capacitor circuit having switches which open and close during predetermined periods such that an instantaneous amplitude value of an analog signal $A_{IN}$ or ground is applied to a capacitor. Thereafter, other switches open and close to forward the sampled amplitude to a summing node 30. The sampled values are summed with either a positive or negative reference voltage fed back from D/A converter 32. D/A converter 32 is essentially a switching unit which switches either a positive or negative reference voltage upon summing node 30 in accordance with the digital value upon D/A converter 32. The additive output from summing node 30 is forwarded to an integrator 34. The output from integrator 34, denoted as $I_1$, is then fed to a quantizer 36. $Y_1$ output from quantizer 36 is then fed back to summing node 30 via D/A converter 32. Integrator 34 essentially functions as an analog filter which has a low-pass effect on the analog signal $A_{IN}$ and a high-pass effect on quantatization noise fed back from the output of quantizer 36. For this reason, integrator 34 is viewed as a noise shaping filter, wherein the stream of digital values $Y_1$ contains a digital representation of the original analog signal as well as high frequency quantization noise. The high frequency quantatization noise can, however, be readily removed by the digital filter 26 or, if the quantatization noise is present within the first stage, removed by the noise cancellation logic 22.

Figure 5:
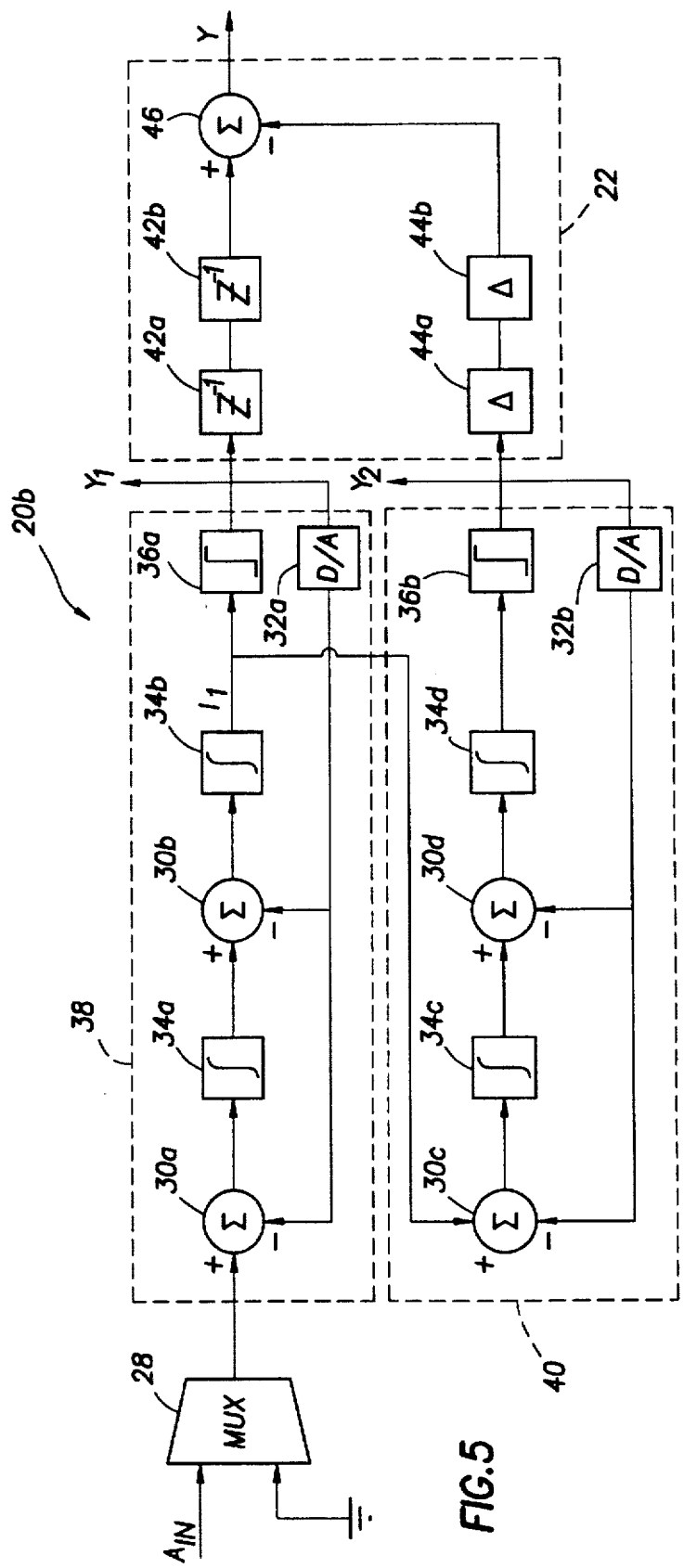
FIG. 5 is a block diagram of cascaded modulators shown according to one embodiment, wherein the cascaded modulators are adapted for placement in the modulator blocks of FIGS. 1 and 2.

In order to achieve a wide dynamic range, delta-sigma modulator loops greater than first order are necessary. FIG. 5 illustrates a multi-stage, or cascaded arrangement of block 20, as represented by embodiment 20b. Depending upon the characteristics needed, either modulator block 20a or 20b can be used within the A/D converters of FIGS. 1 and 2. Modulator block 20b comprises a first stage modulator 38 and a second stage modulator 40. First stage modulator 38 and second stage modulator 40 are shown in exemplary form as second order modulators. It is understood that modulator block 20 can be in cascaded or single stage form, or in multiple order or single order, and that modulator 20 includes any modulator arrangement which produces a bitstream of digital values.

Modulator block 20b is illustrative of an exemplary two stage modulator, with multiplexer 28 at the input of first stage modulator 38. First stage and second stage modulators 38 and 40 include integrators 34a, 34b, 34c and 34d. Modulators 38 and 40 also include summing nodes 30a, 30b, 30c and 30d. A D/A converter or switch control unit 32a and 32b is coupled in respective feedback loops of modulators 38 and 40. The output from integrator 34b is denoted as analog signal $I_1$. Signal $I_1$ is fed from modulator 38 to modulator 40 as shown. The analog signal is essentially an analog-filtered $A_{IN}$ with differentiated quantizer noise therein. Digital representations of signal $I_1$ with direct quantization noise, is forwarded as signal $Y_1$ to delay elements 42a and 42b of noise cancellation logic 22. Analog signal $I_1$, absent direct quantatization noise from quantizer 36a, is summed with the selected reference voltage at summing node 30c. Output from quantizer 36b, shown as signal $Y_2$ thereby contains a multiple differentiated quantatization noise from quantizer 36a and 36b, as well as a digital representation of $A_{IN}$. Signal $Y_2$ is then sent to a double differentiator 44a and 44b of noise cancellation logic 22. The output from delay elements 42 and differentiator elements 44 are summed by noise cancellation summing node 46 to present a digital representation of $A_{IN}$ having differentiated quantizer noise from quantizer 36b but substantially no quantizer noise from quantizer 36a.

Noise cancellation circuit 22 is shown according to one exemplary embodiment. Cancellation circuit 22 can take on numerous forms depending upon the number of modulator stages, etc. Regardless of the form chosen, noise cancellation logic 22 comprises any circuit which yields a digital output signal which contains only the quantization noise of the second stage with second-order noise shaping, given a two stage cascaded arrangement where each stage consists of a second order feedback arrangement. If more than two stages are used, noise cancellation logic 22 functions such that quantatization noise within the first stage is suppressed by the second stage, and quantatization noise in the second stage is suppressed by the third stage, etc. The latter architecture is described as MASH architecture having a single order loop within each stage of three of more cascaded stages. Accordingly, FIG. 5 illustrates only one exemplary form of noise cancellation logic 22. However, it is understood that any form of noise cancellation logic 22 can be utilized, depending upon the architecture of modulator block 20.

Figure 6A:
FIGS. 6a and 6b are timing diagrams of no DC offset upon integrator output signal $I_1$, and quantizer output signal $Y_1$ resulting from an analog signal at midscale (ground voltage) placed on the modulator input.
Figure 6B:
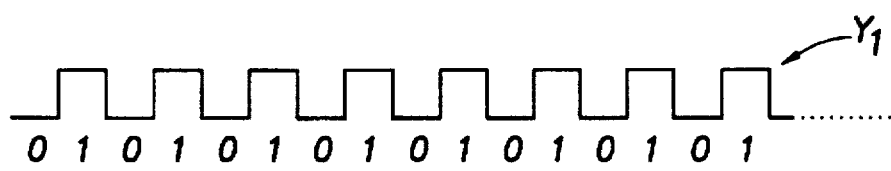
Figure 7A:
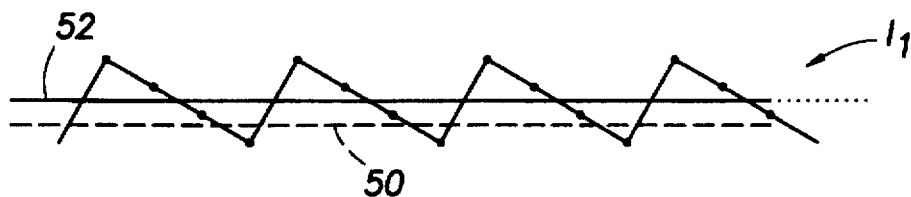
FIGS. 7a and 7b are timing diagrams of DC offset upon an integrator output signal $I_1$, and quantizer output signal $Y_1$ resulting from an analog signal at midscale (ground voltage) placed on the modulator input.
Figure 7B:
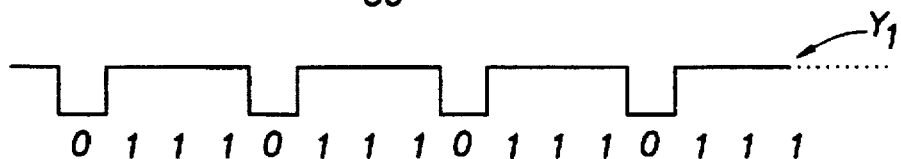

Referring now to FIGS. 6a and 6b, timing diagrams of idealized integrator output signal $I_1$ and quantizer output signal $Y_1$ are shown resulting from a midscale (ground voltage) placed on modulator block 20 input. A ground voltage, selected by multiplexer 12 should, in the ideal sense, cause analog signal $I_1$ to modulate about ground voltage 50. As such, digital output signal $Y_1$ will change between logic 1 and logic 0 values in equal proportion. FIG. 6a illustrates an analog signal with no DC offset, and a resulting digital output signal is presented in FIG. 6b. In a real world instance, DC offset exists, and is represented in FIG. 7a in analog form. More specifically, a positive DC offset 52 exceeds ground voltage 50 where the offset contributes to an upward skew of analog signal voltage, as shown by signal $I_1$. A positive DC offset causes digital output signal $Y_1$ to denote more logic 1s than logic 0s. In the instance shown, three logic 1 values occur for each logic 0 value, representative of a fairly large DC offset amount.

Referring to FIGS. 1, 2, 7a and 7b, a positive DC offset causes counter 14 to count the resulting bitstream in an upward direction, and register 16 to store a positive digital value. Accumulator 18, according to an alternative embodiment, accumulates a large digital value. Register 16 and accumulator 18 store those values during a calibration mode of operation. During normal operation (i.e., noncalibration) summing node 24 subtracts the stored offset value from digital output signal Y (or digital output signal $Y_1$). Digital output signal Y or $Y_1$ is thereby corrected or compensated by the previously stored offset value.

Figure 8:
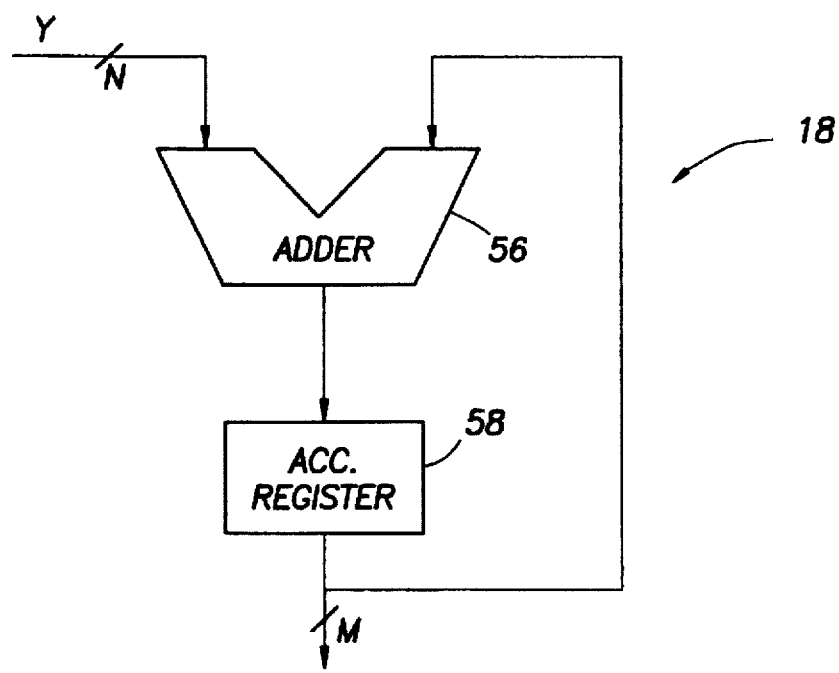
FIG. 8 is a block diagram of the accumulator, shown in FIG. 2, according to one embodiment.

FIG. 8 illustrates one exemplary embodiment of accumulator 18. Accumulator 18 can be realized by an adder 56 and an accumulation register 58. Adder 56 comprises any logic circuit which adds two binary bits and generates a sum and carry output. The adder can perform serial addition or parallel addition, depending upon the number of bits forwarded to its input. Adder 56 is preferably a parallel adder, which adds bits according to their significance, and produces a corresponding bit addition and bit carry to the next significant bit. Accumulation register 58 includes any register for storing a multi-bit word forwarded from adder 56. Add and accumulate operations are continued for time period $t_M$, the conclusion of which allows accumulation register 58 to store finalized digital value representative of the DC offset amount.

It will be appreciated by those skilled in the art having the benefit of this disclosure that this invention is believed to be capable of applications with any oversampled A/D converter. Furthermore, it is also to be understood that the invention shown and described is to be taken as presently preferred embodiments. Various modifications and changes may be made to the modulator, noise cancellation architecture, and digital filter, all this would be obvious to a person skilled in the art without departing from the spirit and scope of the invention as set forth in the claims. It is intended that the following claims be interpreted to embrace all such modifications and changes, and accordingly, the specification and drawings are to be regarded in an illustrative rather a restrictive sense.

What is claimed is:

1. An apparatus for correcting DC offset, comprising:
    a modulator having a modulator input and a modulator output, wherein the modulator output produces a first bitstream in response to a ground voltage upon the modulator input;
    a counter coupled to the modulator output for producing a digital count corresponding to the first bitstream; and
    a summing node coupled to subtract the digital count from a second bitstream output from the modulator output in response to an analog signal upon the modulator input.

2. The apparatus as recited in claim 1, wherein the digital count corresponds to a DC offset value produced at the modulator output in response to the ground voltage upon the modulator input.

3. The apparatus as recited in claim 1, wherein the counter is adapted for counting up for each logic one value and counting down for each logic zero value within said first bitstream.

4. The apparatus as recited in claim 1, wherein said modulator comprises a single order modulator.

5. The apparatus as recited in claim 1, wherein said modulator comprises a multiple order modulator.

6. The apparatus as recited in claim 1, further comprising a multiplexer coupled for selecting either the ground voltage or the analog signal for connection to the modulator input.

7. The apparatus as recited in claim 1, further comprising a digital filter coupled to receive an output from said summing node.

8. An apparatus for correcting DC offset within an A/D converter, said A/D converter comprising:

a first modulator having a first modulator input and a first modulator output, wherein at least one integrator and a quantizer are coupled in series between the first modulator input and the first modulator output, and wherein the first modulator output produces a first bitstream in response to a ground voltage upon the first modulator input;

a second modulator having a second modulator output and a second modulator input, said second modulator input is coupled to receive an output of said at least one integrator;

a counter coupled to receive only the first modulator output and store a digital count corresponding to a number of logic one bits minus logic zero bits within said first bitstream;

noise cancellation logic coupled to receive said first and second modulator outputs and produce a noise suppressed multi-bit digital signal; and a summing node coupled to subtract the digital count from the noise suppressed multi-bit digital signal in response to an analog signal upon the modulator input.

9. The apparatus as recited in claim 8, wherein said noise cancellation logic comprises:

a double differentiator coupled to receive the second modulator output;

a delay circuit coupled to receive the first modulator output; and a noise cancellation node coupled to receive output from the double differentiator and the delay circuit.

10. The apparatus as recited in claim 8, wherein the digital count correspnds to a DC offset value produced at the first modulator output in response to the ground voltage upon the first modulator input.

11. The apparatus as recited in claim 8, wherein the counter is adapted for count up for each logic one value and counting down for each logic zero value within said first series of digital signals.

12. The apparatus as recited in claim 8, wherein the first and second modulators each comprise at least one integrator and at least one feedback summing node.

13. The apparatus as recited in claim 8, further comprising:

a multiplexer having inputs for receiving the analog signal, the ground voltage and a calibration signal; and a switched capacitor sampling circuit coupled to receive either the analog signal or the ground voltage depending upon the status of the calibration signal.

14. An apparatus for correcting DC offset within an A/D converter, said A/D converter comprising:

a modulator having a modulator input adapted to receive a ground voltage during a calibration cycle and an analog signal during a non-calibration cycle;

a noise cancellation logic having a logic input and a logic output, said logic input is coupled to receive a quantized DC offset produced by said modulator during said calibration cycle and is further coupled to receive quantized said analog signal during said non-calibration cycle;

an offset compensation circuit coupled to said logic output for storing a first digital count corresponding to said quantized DC offset; and a summing node coupled to said DC storage and correction circuit for subtracting said first digital count from the quantized said analog signal.

15. The apparatus as recited in claim 14, wherein said quantized said analog signal is a multi-bit digital signal at said logic output.

16. The apparatus as recited in claim 14, wherein said offset compensation circuit comprises an accumulator.

17. The apparatus as recited in claim 16, wherein said accumulator comprises a register coupled to an output of an adder, said adder having two inputs wherein one input is coupled to said logic output and the other input is coupled to the output of said register.

18. The apparatus as recited in claim 14, further comprising a digital decimation filter coupled to the output of said summing node.

19. A method for correcting DC offset at the output of an A/D converter, comprising:

quantizing discrete samples of a ground voltage during a calibration cycle;

storing the quantized ground voltage samples as a digital DC offset value;

quantizing discrete samples of an analog signal during a non-calibration cycle; and subtracting the digital DC offset value from the quantized analog signal samples during the non-calibration cycle.

20. The method as recited in claim 19, wherein both said quantizing steps comprise analog-to-digital converting respective said ground voltage and said analog signal.

21. The method as recited in claim 19, wherein said storing comprises counting up for each logic one value and counting down for each logic zero value arising within the quantized ground voltage samples.

22. The method as recited in claim 19, wherein said storing comprises accumulating the addition of logic values within the quantized ground voltage samples.

* * * * *